(12) United States Patent
Moroz et al.

(10) Patent No.: US 11,837,280 B1
(45) Date of Patent: Dec. 5, 2023

(54) CFET ARCHITECTURE FOR BALANCING LOGIC LIBRARY AND SRAM BITCELL

(71) Applicant: Synopsys, Inc., Mountain View, CA (US)

(72) Inventors: Victor Moroz, Saratoga, CA (US); Deepak Sherlekar, Cupertino, CA (US); Jamil Kawa, Campbell, CA (US)

(73) Assignee: Synopsys, Inc., Sunnyvale, CA (US)

( * ) Notice: Subject to any disclaimer, the term of this patent is extended or adjusted under 35 U.S.C. 154(b) by 409 days.

(21) Appl. No.: 16/995,556

(22) Filed: Aug. 17, 2020

Related U.S. Application Data

(60) Provisional application No. 63/027,719, filed on May 20, 2020.

(51) Int. Cl.
*G11C 11/412* (2006.01)
*G06F 30/32* (2020.01)
*H10B 10/00* (2023.01)

(52) U.S. Cl.
CPC ............ *G11C 11/412* (2013.01); *G06F 30/32* (2020.01); *H10B 10/12* (2023.02)

(58) Field of Classification Search
CPC ... G11C 11/412; G06F 30/32; H01L 27/1104; H10B 10/12
See application file for complete search history.

(56) References Cited

U.S. PATENT DOCUMENTS

| | | | | |
|---|---|---|---|---|
| 2018/0174896 A1* | 6/2018 | Licausi | ............... | H01L 23/5283 |
| 2019/0172751 A1* | 6/2019 | Smith | ............. | H01L 21/823821 |
| 2021/0020643 A1* | 1/2021 | Yang | ..................... | H01L 29/775 |

* cited by examiner

*Primary Examiner* — Nha T Nguyen
(74) *Attorney, Agent, or Firm* — Lowenstein Sandler LLP

(57) ABSTRACT

The independent claims of the present disclosure signify a concise description of embodiments. An electronic structure based on complementary-field effect transistor (CFET) architecture is disclosed. The electronic structure comprises an n-channel metal-oxide-semiconductior (NMOS) gate-all-around (GAA) channel in a first layer, and p-channel metal-oxide-semiconductor (PMOS) GAA channel in a second layer. The PMOS GAA channel is wider compared to the NMOS GAA channel. The first layer is above the second layer and separated by a dielectric layer.

20 Claims, 15 Drawing Sheets

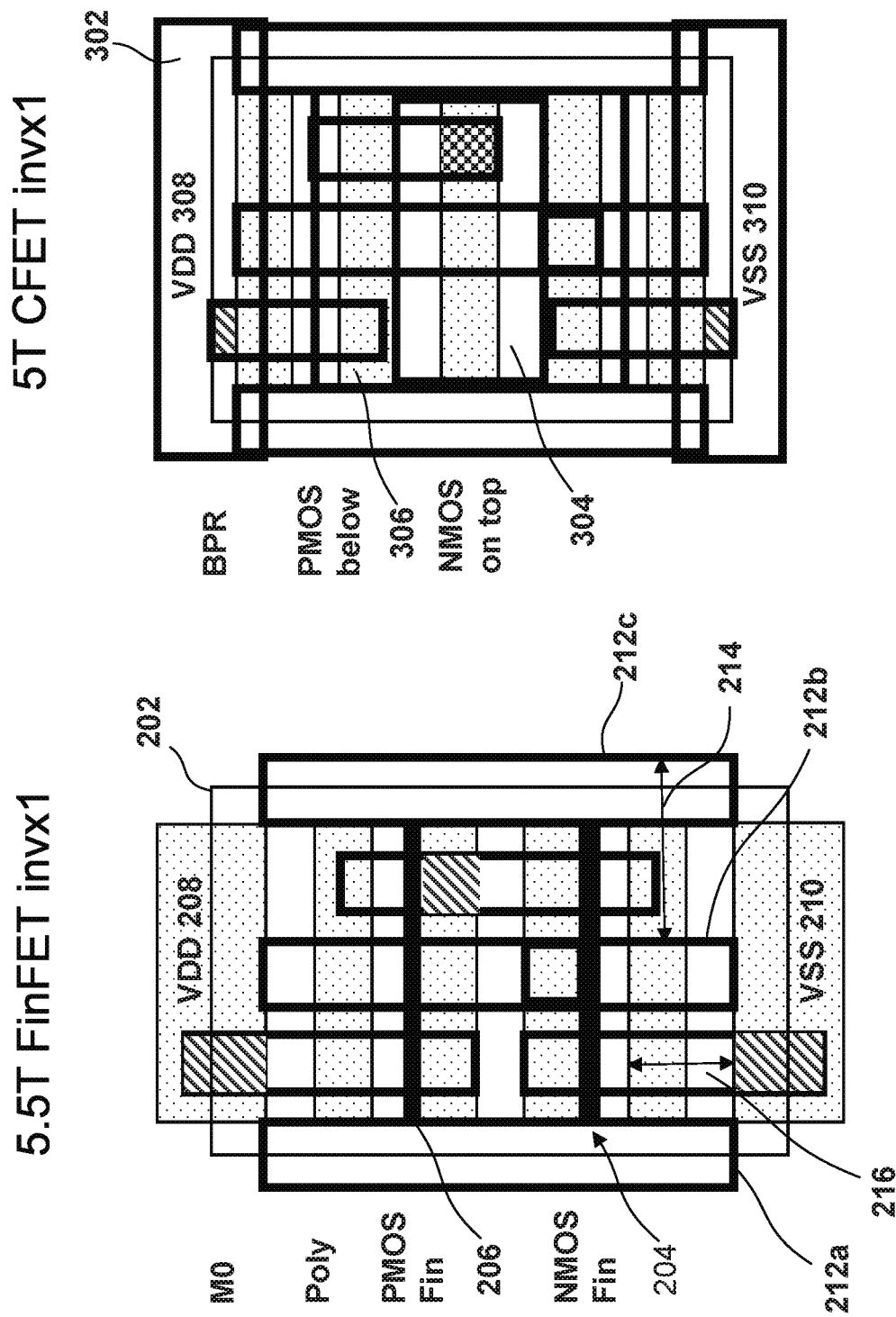

CFET ARCHITECTURE FOR BALANCING LOGIC LIBRARY AND SRAM BITCELL

FIELD(S) OF TECHNOLOGY

The present disclosure is related to the field of integrated circuit design, including an static random access memory (SRAM) bitcell and a logic cell based on CFET architecture.

BACKGROUND

Currently, the semiconductor-manufacturing industry is pushing for 3 nanometer (nm) node gate-all-around field-effect transistor GAAFET based technology to produce the highest transistor density of about 290 million transistors per square millimeter. The 3 nm node GAAFET based technology is also a potential 3 nm technology. The 3 nm technology is about 15 percent away from reaching the limit of patterning pitch scaling. Pitch scaling is based on contacted gate pitch and minimum metal pitch. Contacted gate pitch, also referred to as contacted poly pitch (CPP), refers to the smallest possible distance between gates on a gate layer. Minimum metal pitch (MP), also referred to as interconnect pitch, refers to the smallest possible distance between the centers of adjacent wires on interconnect metal layers. Smaller values of the CPP and MP enable more transistors per square millimeter to provide more functionality. However, the values of CPP and MP are not expected go below approximately 40 nm and 20 nm, respectively, due to fundamental limitations of dielectric leakage, metal wire resistance, parasitic capacitance, and transistor leakage. Therefore, the maximum transistor density that may be obtained with FinFET and GAA FET would be about 450 million transistors per square millimeter. A solution is desired to increase the transistor density beyond 450 million transistors per square millimeter.

SUMMARY

The claims signify a brief description of one or more of the innovations, embodiments, and/or examples found within this disclosure.

In one embodiment, CFET architecture of patterning mid-width stress-free multi-layer NMOS over a wider channel strained PMOS for a logic library is disclosed. In the embodiment, NMOS transistors are in a plurality of layers, and PMOS transistors are in fewer layers compared to the NMOS transistors. PMOS transistors have channels that are as wide as possible to fit within the cell height, which makes them about 2 metal tracks narrower than the cell height. NMOS transistors have channels that are as wide as possible to allow connections for two metal tracks to the PMOS transistors below, which makes the NMOS channels about 3.5 tracks narrower than the cell height. Electrical strength capacity, i.e., an electrical current capacity of the PMOS transistors and NMOS transistors, is balanced for optimal circuit switching behavior. Contact access to the wider strained lower layer or lower tier is provided around the narrower upper transistor layer or upper tier. Stress sources for the PMOS transistors at the lower layer are the SiGe epitaxial source and drain, and, thereby, increasing the transistor density with respect to the FinFETS and GAAFETs and performance of the cell. By way of a non-limiting example, a transistor density of about 1 billion transistors per square millimeter may be obtained.

In yet another embodiment, CFET architecture for an SRAM bitcell is disclosed with narrow NMOS and PMOS transistors to provide wide word line (WL) increasing data storage capacity of SRAM memory banks. Contacted poly pitch (CPP) and minimum metal pitch (MP) of about 40 nm and 20 nm, respectively, are maintained in the SRAM bitcell while increasing transistor density by a factor of at least two. A 2:1 ratio of the NMOS transistor driving strength to PMOS transistor driving strength is used for achieving optimal SRAM performance.

This Summary does not attempt to signify any particular innovation, embodiment, or example entirely as it can be used in commerce. Additionally, this Summary is not intended to signify essential elements of an innovation, embodiment, or example or to limit the scope of the subject matter of this disclosure.

The innovations, embodiments, and/or examples found within this disclosure are not all-inclusive, but rather describe the basic significance of the subject matter. Accordingly, one use of this Summary is as a prelude to a Detailed Description presented later.

DRAWINGS

The following Detailed Description, Figures, appended Additional Figures and appended Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such figures are not necessarily drawn to scale and are part of the disclosure.

In the figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

FIG. 2 illustrates a layout view of a FinFET inverter cell with a cell height of 5.5 metal tracks.

FIG. 3 illustrates a top view of an inverter cell based on CFET architecture, in accordance with some embodiments.

In such various figures, reference signs may be omitted as is consistent with accepted engineering practice. However, one of ordinary skill in the art will understand that the illustrated components are readily understood when viewed in the context of the illustration as a whole and the accompanying disclosure describing such various figures.

DETAILED DESCRIPTION

The Figures and the following Detailed Description signify innovations, embodiments, and/or examples by way of illustration only, with various features, structures, or characteristics described together in a single embodiment to streamline the disclosure. Variations of any of the elements, processes, machines, systems, manufactures, or compositions disclosed by such exemplary innovations, embodiments, and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to enable one or more of the exemplary innovations, embodiments, and/or examples. In the interest of not obscuring the presentation of the exemplary innovations, embodiments, and/or examples in the following Detailed Description, some processing steps or operations that are known in the art may be combined for presentation and illustration purposes and might not be described in detail. However, a person skilled in the art will recognize that these exemplary innovations, embodiments, and/or examples may be used in commerce without these specific details or with equivalents thereof. In other instances, well-known processes and devices are not described in detail as not to unnecessarily obscure aspects of these exemplary innovations, embodiments, and/or examples. In other instances, some processing steps or operations that are known in the art may not be described at all. Instead, the following description is focused on the distinctive features or elements of various exemplary innovations, embodiments, and/or examples. Furthermore, while this description may refer to some components of the structure in the singular tense, more than one component may be depicted throughout the figures, and like components are labeled with like numerals.

N-channel metal-oxide-semiconductor (NMOS) and p-channel metal-oxide-semiconductor (PMOS) transistors are stacked on top of each other to increase transistor density using CFET architecture. This approach of stacking the transistors can be instrumental in increasing transistor density beyond 450 million transistors per square millimeter. Further, stacking of the NMOS and PMOS transistors affects stress engineering, and considerably reduces stress levels at the upper transistor tier. The stacked NMOS and PMOS transistors may be separated by a dielectric layer.

Figure 1:
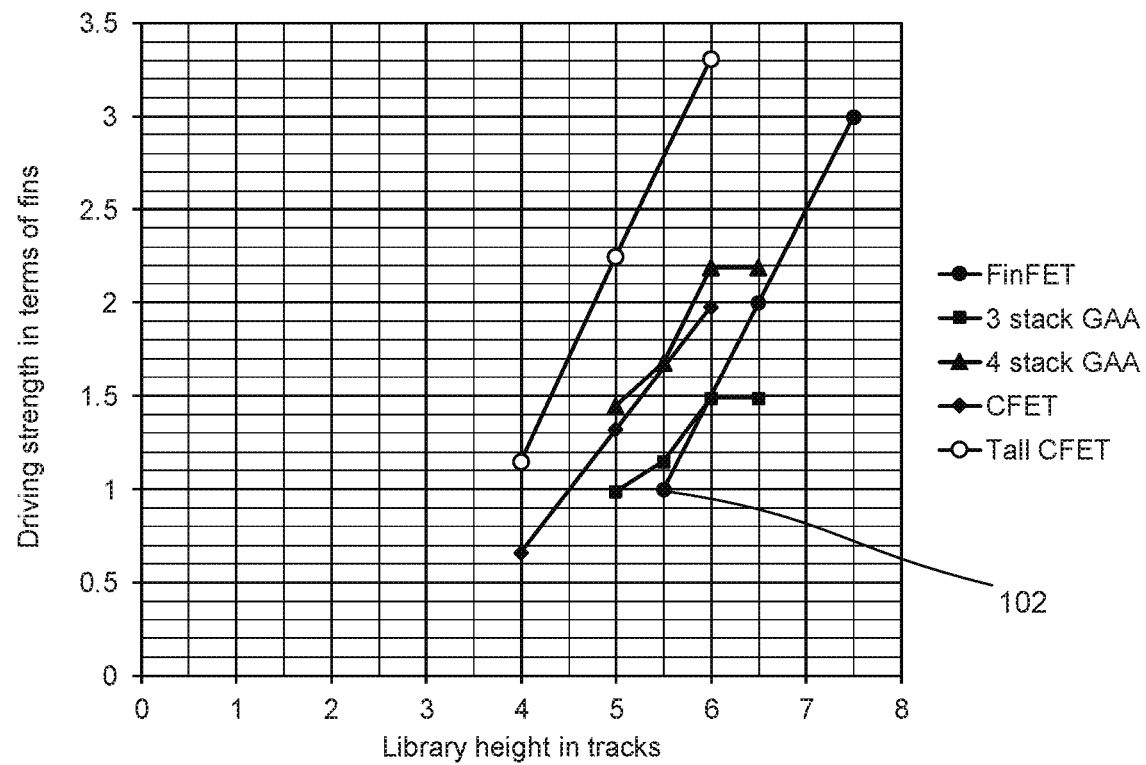
FIG. 1 illustrates a chart showing logic library driving strength in terms of fins as a function of the cell height that is expressed as a number of metal pitches.

FIG. 1 illustrates a chart showing driving strength in terms of fins and a number of metal pitches in a logic cell height. The cell may be based on a FinFET transistor, a GAA transistor with three stacks of NMOS and PMOS transistors, a GAA transistor of 4 stacks of NMOS and PMOS transistors, a CFET, and a tall CFET. As the number of fins increases, the number of required metal tracks may also increase. For example, a FinFET with one fin may require a cell height of five and a half (5.5) metal tracks. The FinFET with one fin may include one NMOS fin and one PMOS fin, a gate, a power supply rail (VDD), and a ground rail (VSS). A FinFET cell with three fins may include three NMOS fins and three PMOS fins, a gate, and power rails. The FinFET cell with three fins requires the cell height of 7.5 metal tracks, as shown in FIG. 1 by 102. As shown in FIG. 1, 3-Stack GAA, 4-Stack GAA, CFET, and tall CFET each offer an improvement over the FinFET cell since a shorter cell height for a comparable driving strength is required. The shorter cell height increases transistor density. Further, it can be seen that CFET based cell achieves the shortest cell height, and the strongest driving strength with respect to any of the FinFET, 3 Stack GAA, 4 Stack GAA.

FIG. 2 illustrates a layout view of a FinFET inverter cell having a cell height of 5.5 metal tracks. For the FinFET inverter cell 202, the cell height is equivalent to 5.5 metal tracks. The FinFET inverter cell 202 is a state of the art inverter design for single fin and single finger (where "finger" stands for a gate) strength. Being single fin strength, it means the FinFET inverter cell 202 includes an NMOS fin 204 and a PMOS fin 206. In addition, power rails for power supply voltage VDD 208 and for ground VSS 210 are shown. The power rails for VDD 208 and VSS 210 are on top metal layer, i.e., M0. Dummy gates 212a, 212c, and an active gate 212b are shown. The active gate is used to perform logic functions, like inverter switching in this case, and dummy gates are used to isolate this cell from the adjacent cells. As shown in FIG. 2, a gate pitch is shown as 214 and a metal pitch is shown as 216. The FinFET inverter cell 202 shares its boundary elements like power rails and dummy gates with adjacent cells.

FIG. 3 illustrates a top view of an inverter cell based on CFET architecture, in accordance with some embodiments. As shown in FIG. 3, an inverter cell 302, based on CFET architecture, is a single finger strength inverter. The inverter cell 302 may include an NMOS GAA channel 304 and a PMOS GAA channel 306. However, the NMOS GAA channel 304 is narrower compared to the PMOS GAA channel 306 so that the resistance of the NMOS GAA chanel and the PMOS GAA channel has the same value. Further, the NMOS GAA channel 304 is located above the PMOS GAA channel 306. Further, because the NMOS GAA channel 304 in a higher-level tier is narrow, contacts may be inserted around the NMOS GAA channel 304 to reach to the bottom PMOS transistors. As shown in FIG. 3, the CFET inverter cell 302 has a cell height of five metal tracks. By way of a non-limiting example, the inverter cell 302 may share its power rails and dummy gates with adjacent cells in a similar way to the FinFET cell resulting in resistance improvement.

Figure 4:
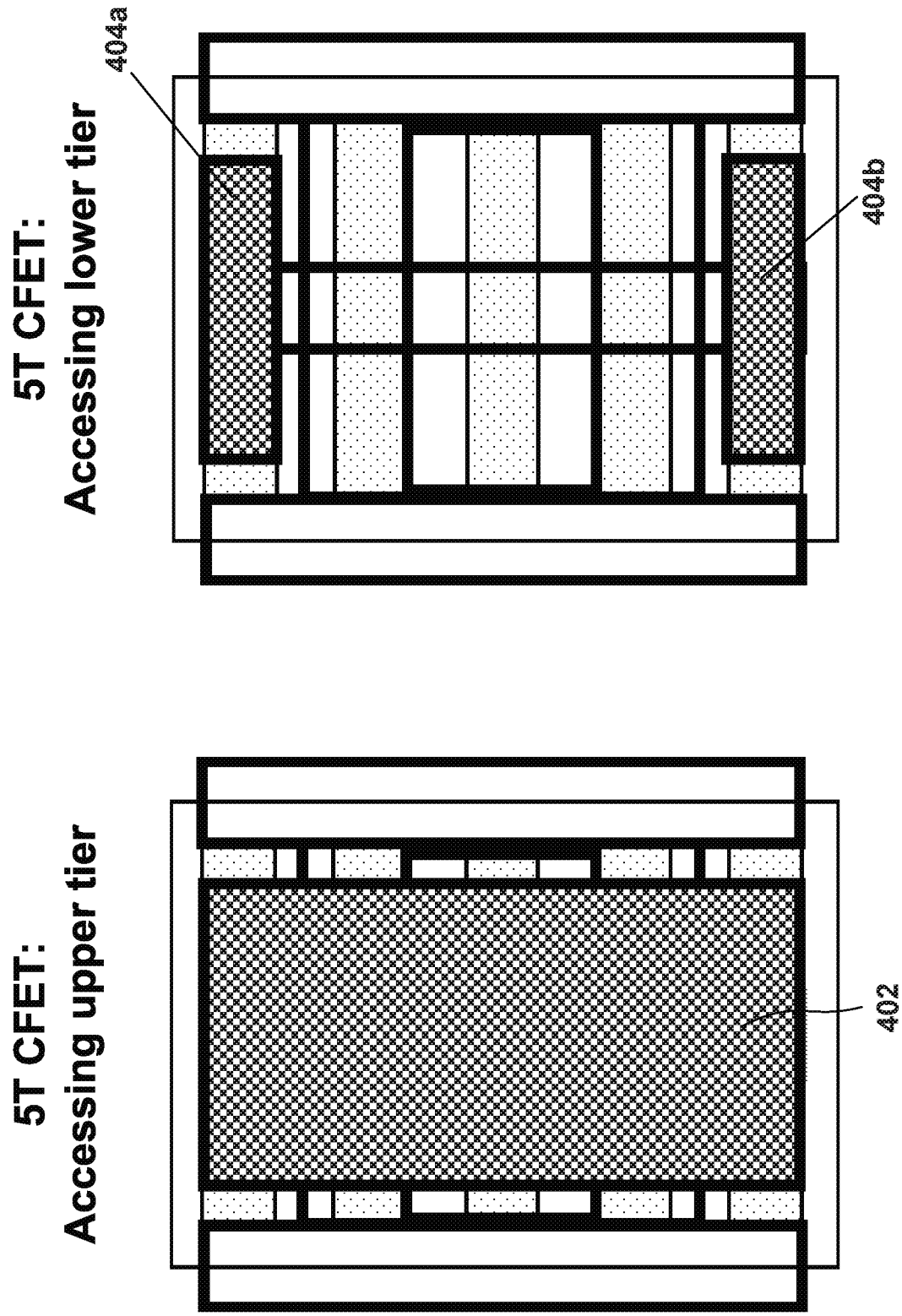
FIG. 4 illustrates accessing upper and lower transistor tiers of the inverter cell shown in FIG. 3, in accordance with some embodiments.

FIG. 4 illustrates accessing transistors on different tiers of the inverter cell shown in FIG. 3, in accordance with some embodiments. As described above, an area marked 402 has access to the top transistor tier. As shown in FIG. 4, a space marked as 404a and 404b around the narrower NMOS channel 302 at the top tier may be used to access the gate and source/drain of the lower transistor tiers.

FIGS. 5-10 disclose various configurations of CFET cells in a variety of cell heights are described showing scalability of the CFET based architecture, in accordance with embodiments. In particular, CFET cells of 6 T, 5 T, and 4 T track heights are discussed below. In addition, the NMOS channel to PMOS channel ratio may also be varied according to the desired electrical strength of the cell.

Figure 5:
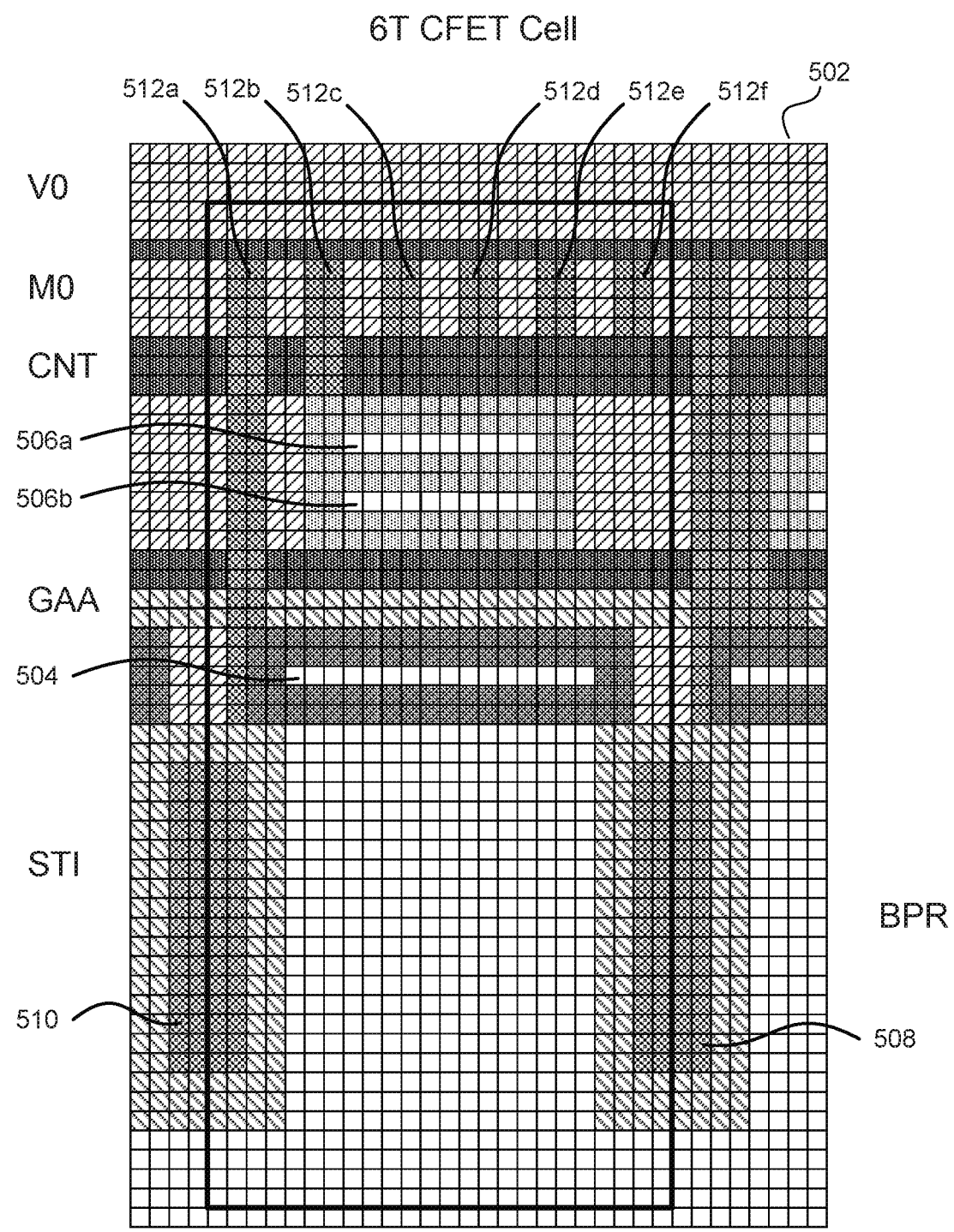
FIG. 5 illustrates a cross-sectional view of a CFET cell of 6 T (6 tracks tall), in accordance with some embodiments.

FIG. 5 illustrates a cross-sectional view of a CFET cell of 6 T (i.e., 6 track tall), in accordance with some embodiments. A CFET cell 502 may include six metal tracks for signal routing marked 512a-f. The CFET cell 502 may include one PMOS transistor 504 and 2 NMOS transistors 506a and 506b that are connected together in parallel by sharing the same source, gate, and drain. Power rails VDD 508 and ground 510 of the CFET cell 502 are buried below transistors. The CFET cell 502 shares its power rails with adjacent cell rows.

Figure 6:
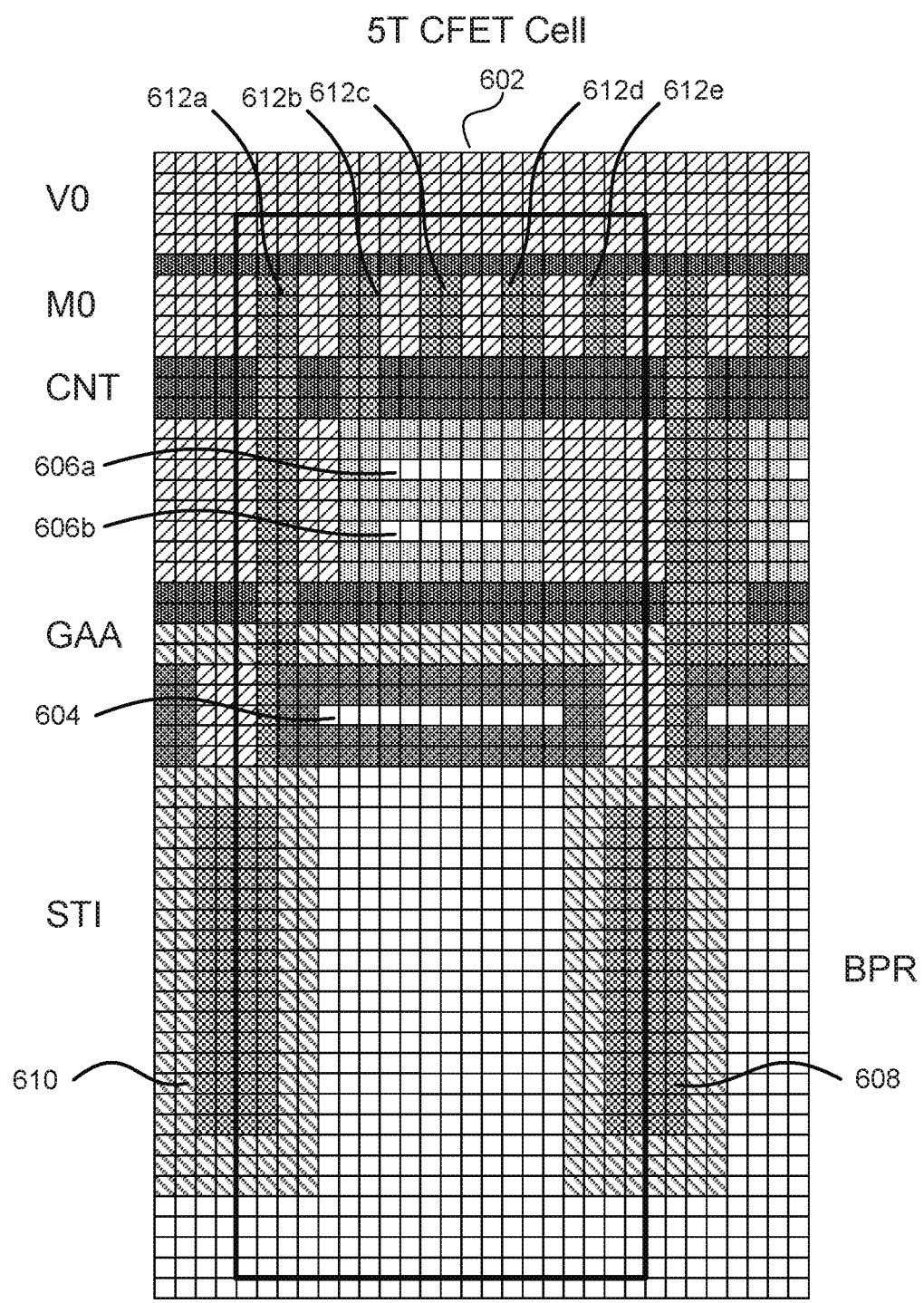
FIG. 6 illustrates a cross-sectional view of a CFET cell of 5 T, in accordance with some embodiments.

FIG. 6 illustrates a cross-sectional view of a CFET cell of 5 T, in accordance with some embodiments. A CFET cell 602 may include five metal tracks 612a-e. The CFET cell 602 may include one PMOS transistor 604 and 2 NMOS transistors 606a and 606b that are connected together. Power rails VDD 608 and ground 610 of the CFET cell 602 are buried below transistors.

Figure 7:
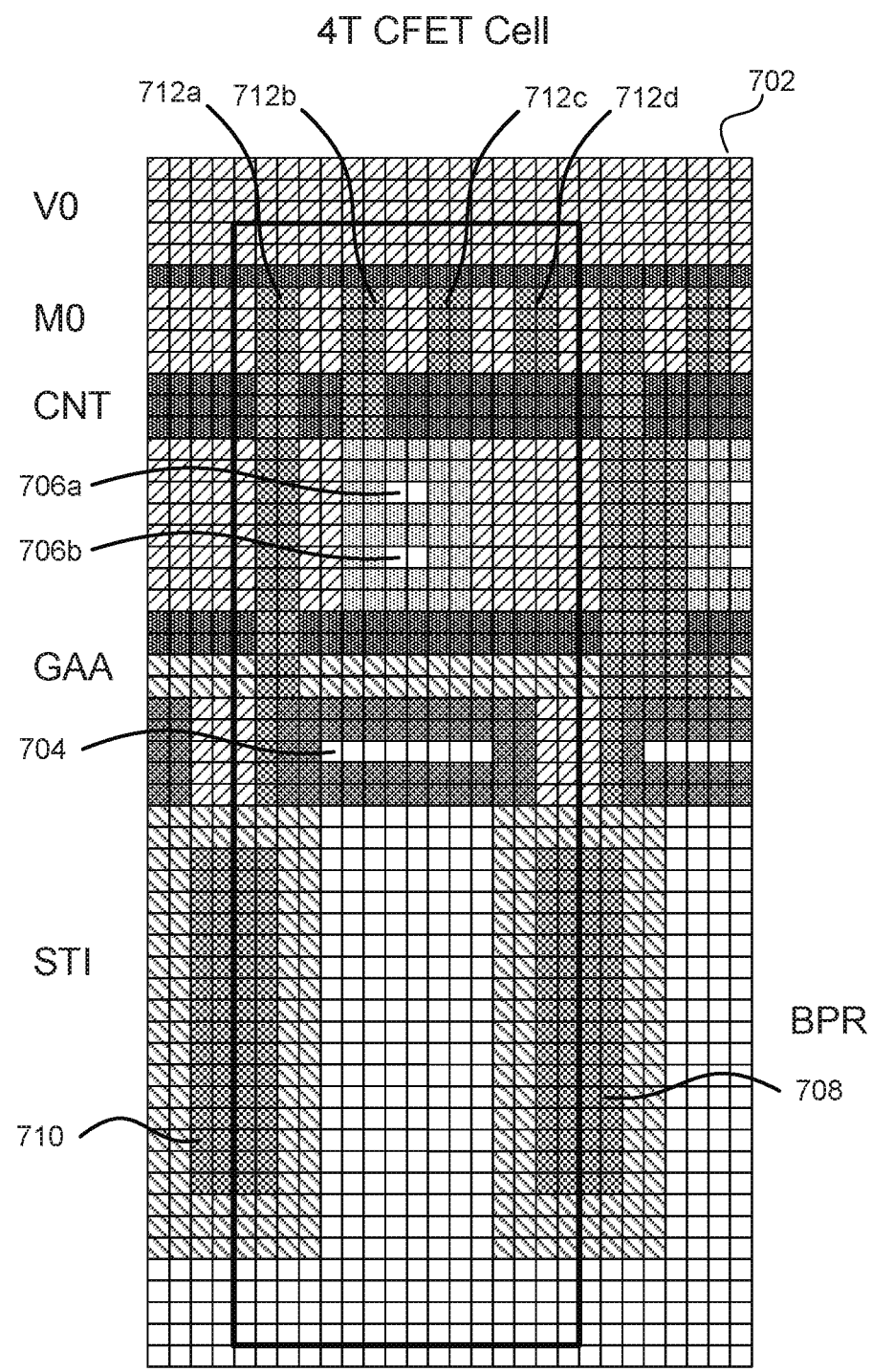
FIG. 7 illustrates a cross-sectional view of a CFET cell of 4 T, in accordance with some embodiments.

FIG. 7 illustrates a cross-sectional view of a CFET cell of 4 T, in accordance with some embodiments. A CFET cell 702 includes four metal tracks marked as 712a-d. The CFET cell 702 may include one PMOS transistor 704 and 2 NMOS transistors 706a and 706b that are connected together. Power rails VDD 708 and ground 710 of the CFET cell 702 are buried below transistors.

Figure 8:
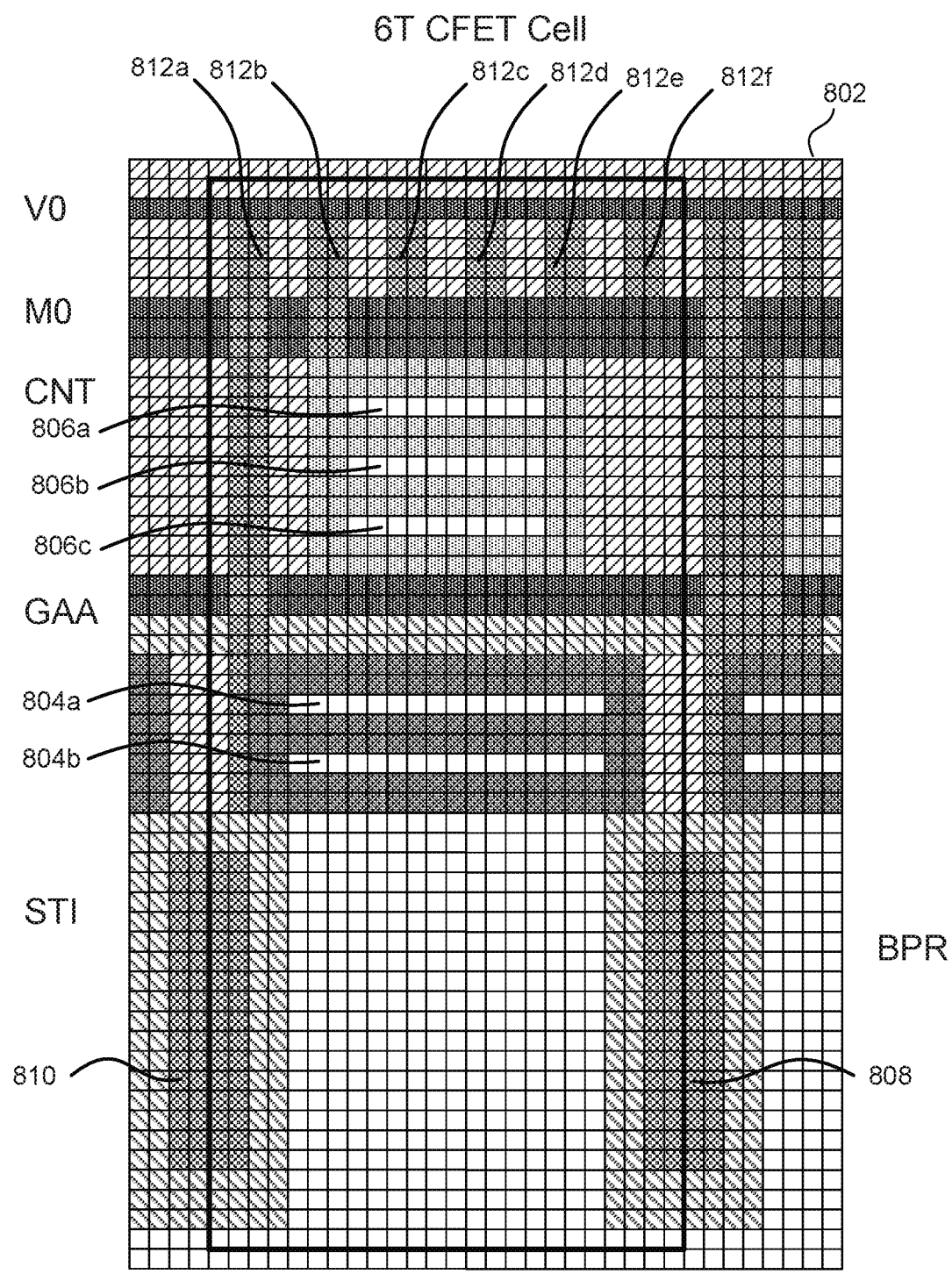
FIG. 8 illustrates a cross-sectional view of a tall CFET cell of 6 T, in accordance with some embodiments.

FIG. 8 illustrates a cross-sectional view of a tall CFET cell of 6 T, in accordance with some embodiments. A CFET cell 802 includes six metal tracks marked 812a-f. The CFET cell 802 may include two PMOS transistor 804a and 804b that are connected together in parallel, and 3 NMOS transistors 806a, 806b, and 806c that are connected together in parallel. Power rails for VDD 808 and ground 810 of the CFET cell 802 are buried below transistors. The CFET cell 802 shares its power rails with adjacent cell rows.

Figure 9:
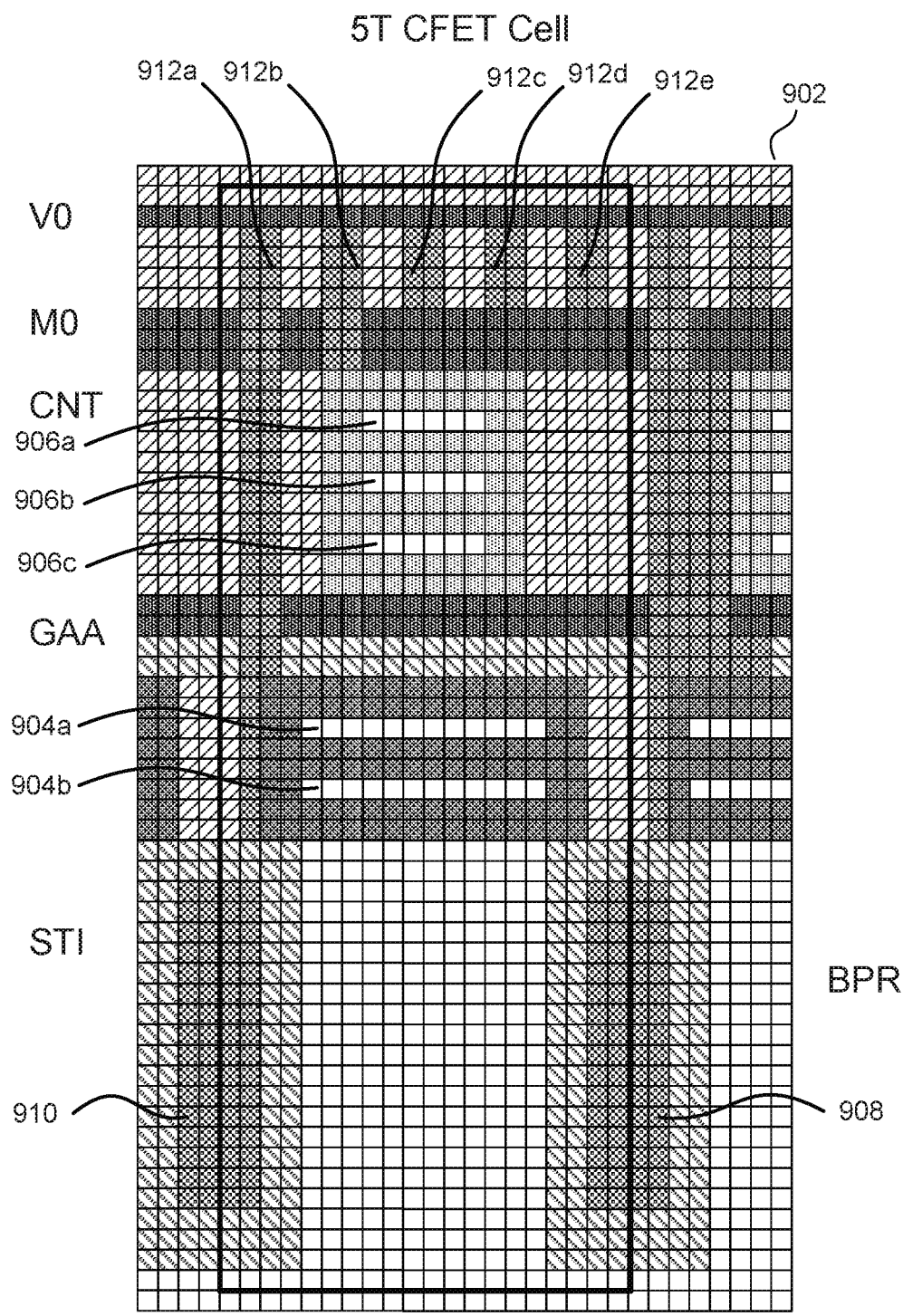
FIG. 9 illustrates a cross-sectional view of a tall CFET cell of 5 T, in accordance with some embodiments.

100401 FIG. 9 illustrates a cross-sectional view of a tall CFET cell of 5 T, in accordance with some embodiments. A CFET cell 902 includes five metal tracks, which are marked as 912a-e. The CFET cell 902 may include two PMOS transistor 904a and 904b, and 3 NMOS transistors 906a, 906b, and 906c. Power rails for the source VDD 908 and ground 910 of the CFET cell 902 are buried below transistors.

Figure 10:
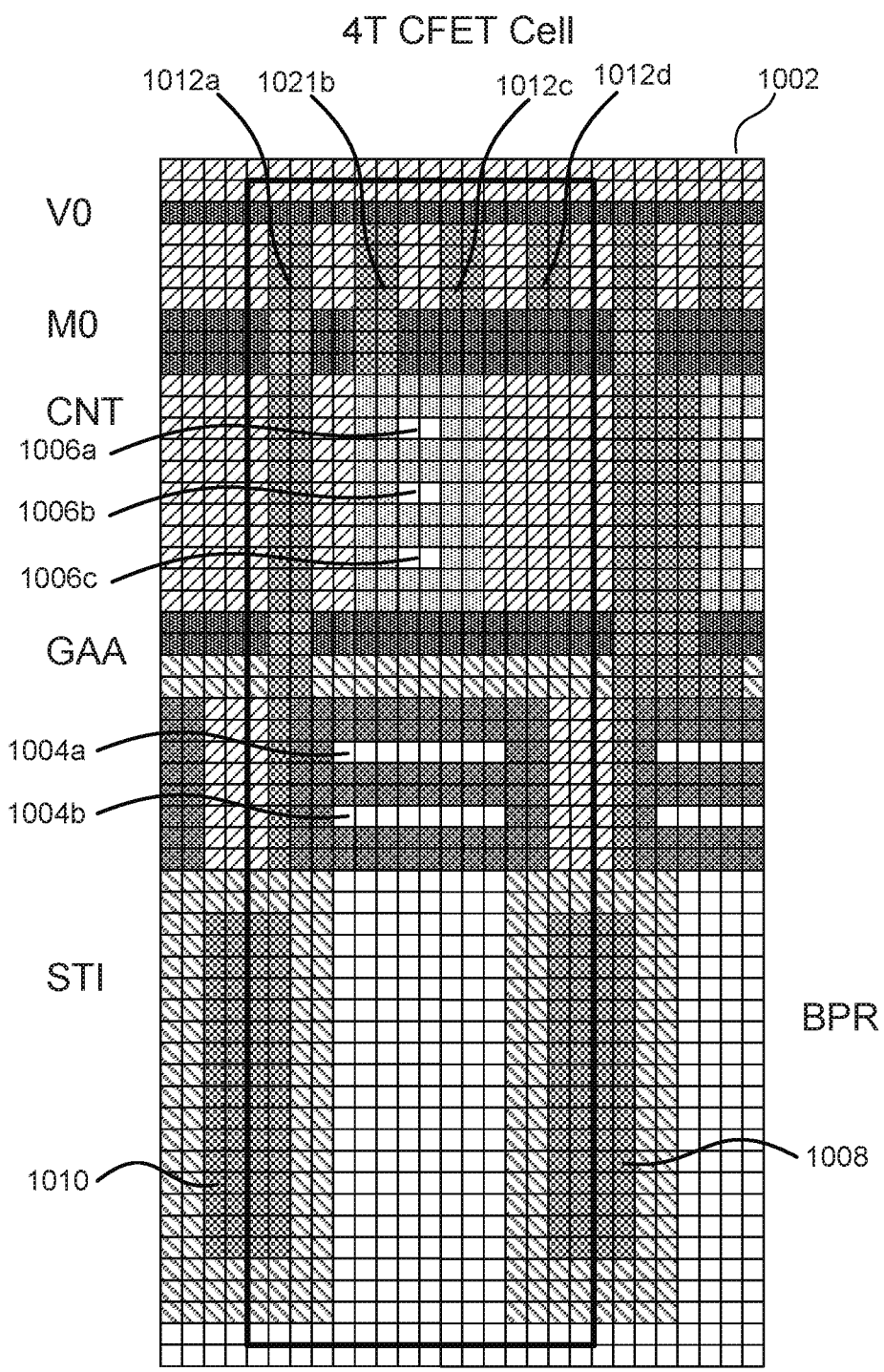
FIG. 10 illustrates a cross-sectional view of a tall CFET cell of 4 T, in accordance with some embodiments.

FIG. 10 illustrates a cross-sectional view of a tall CFET cell of 4 T, in accordance with some embodiments. A CFET cell 1002 includes four metal tracks 1012a-d. The CFET cell 1002 may include two PMOS transistor 1004a and 1004b, and 3 NMOS transistors 1006a, 1006b, and 1006c. Power rails VDD 1008 and ground 1010 of the CFET cell 1002 are buried below transistors.

By way of a non-limiting example, in the inverter cell using CFET architecture, a strained PMOS channel with 1 or 2 GAA layers and a narrower stress free NMOS channel with 2 or 3 GAA layers may balance the NMOS/PMOS driving strengths.

The above disclosure relates to a digital logic cell implemented based on CFET architecture. The CFET architecture based cell may also be used as an SRAM bitcell. FIGS. 11-14 describe an SRAM bitcell based on a CFET architecture.

Figure 11:
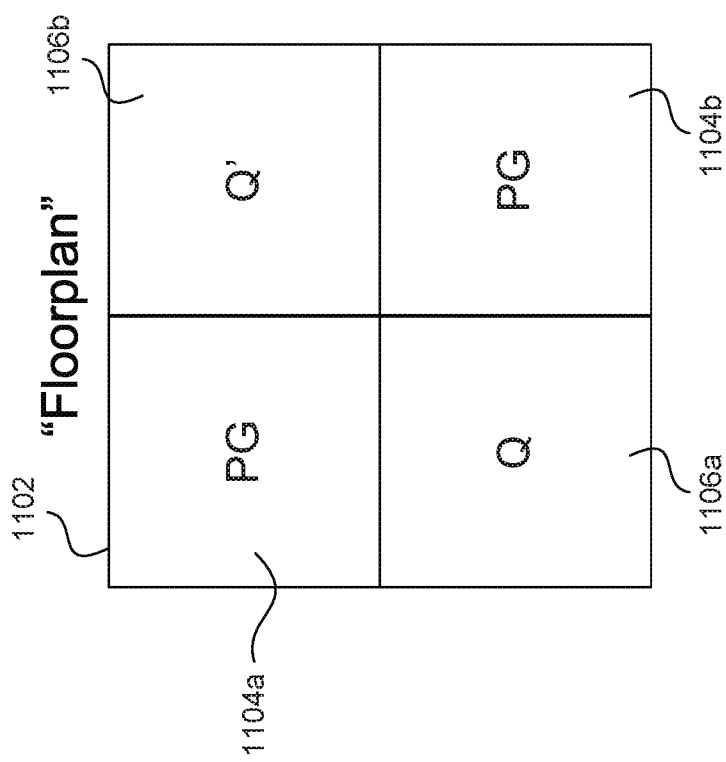
FIG. 11 illustrates a floorplan of an SRAM bitcell using CFET architecture, in accordance with some embodiments.

FIG. 11 illustrates a floorplan of an SRAM bitcell using CFET architecture, in accordance with some embodiments. A floorplan 1102 of an SRAM bitcell includes pass gates 1104a and 1104b, and cross-coupled inverters 1106a and 1106b.

Figure 12:
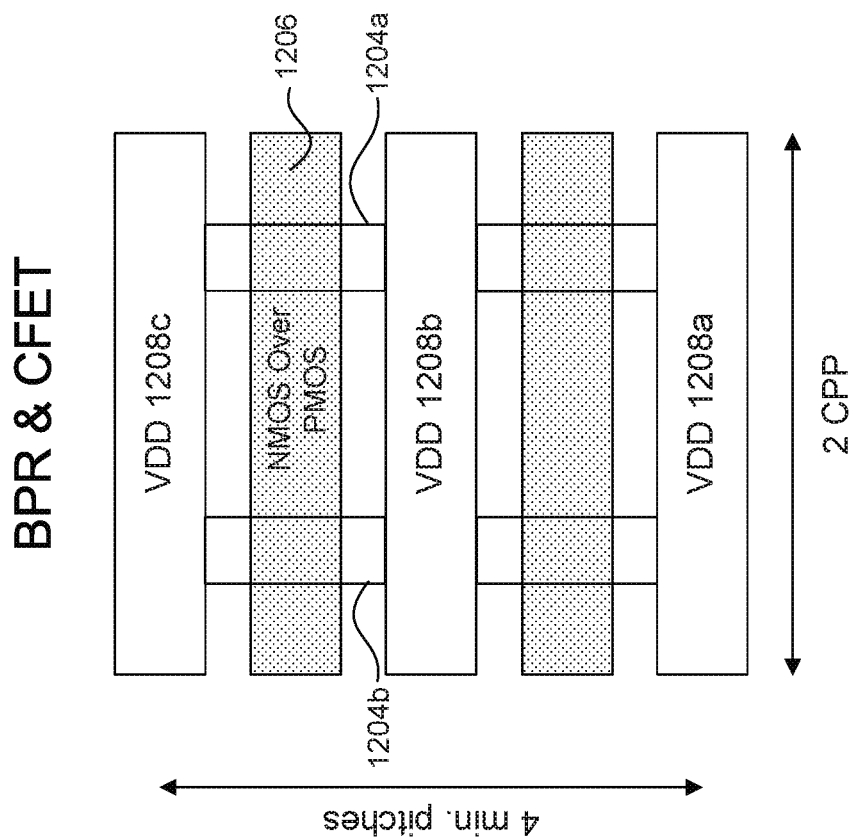
FIG. 12 illustrates a top view of an SRAM bitcell using CFET architecture in accordance with some embodiments.

FIG. 12 illustrates a top view of an SRAM bitcell using CFET architecture in accordance with some embodiments. Similar to a CFET based cell as shown in FIGS. 3-10, an SRAM bitcell 1202 may include an NMOS GAA channel and an PMOS GAA channel. The PMOS channel is below the NMOS channel as shown by 1206. Gates 1204a and 1204b are shown. In addition, powers rails VDD 1208a, 1208b, and 1208c, are buried in silicon, and may not be on a top metal layer.

Figure 13:
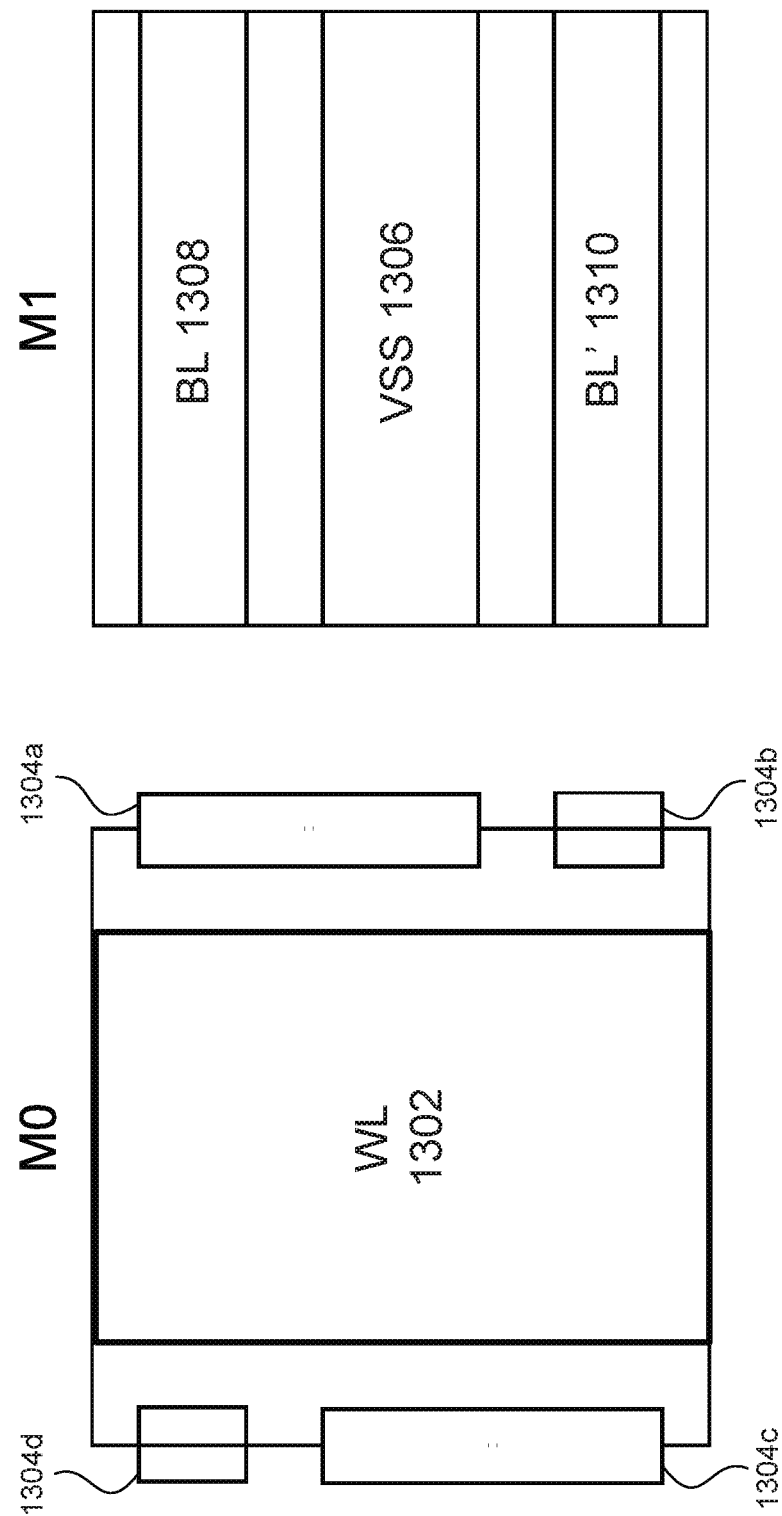
FIG. 13 illustrates another top view of an SRAM bitcell using CFET architecture in accordance with some embodiments.

FIG. 13 illustrates another top view of an SRAM bitcell using CFET architecture in accordance with some embodiments. As shown in FIG. 13, a metal layer M0 above the transistors may include a word line 1302, which includes a plurality of SRAM bitcells arranged in a row. Areas to pass wires for accessing transistors are marked by 1304a, 1304b, 1304c, and 1304d. In another metal layer M1, which is above M0, may include ground VSS power rail 1306. Bit lines 1308 and 1310 may also be on the metal layer M1.

Figure 14:
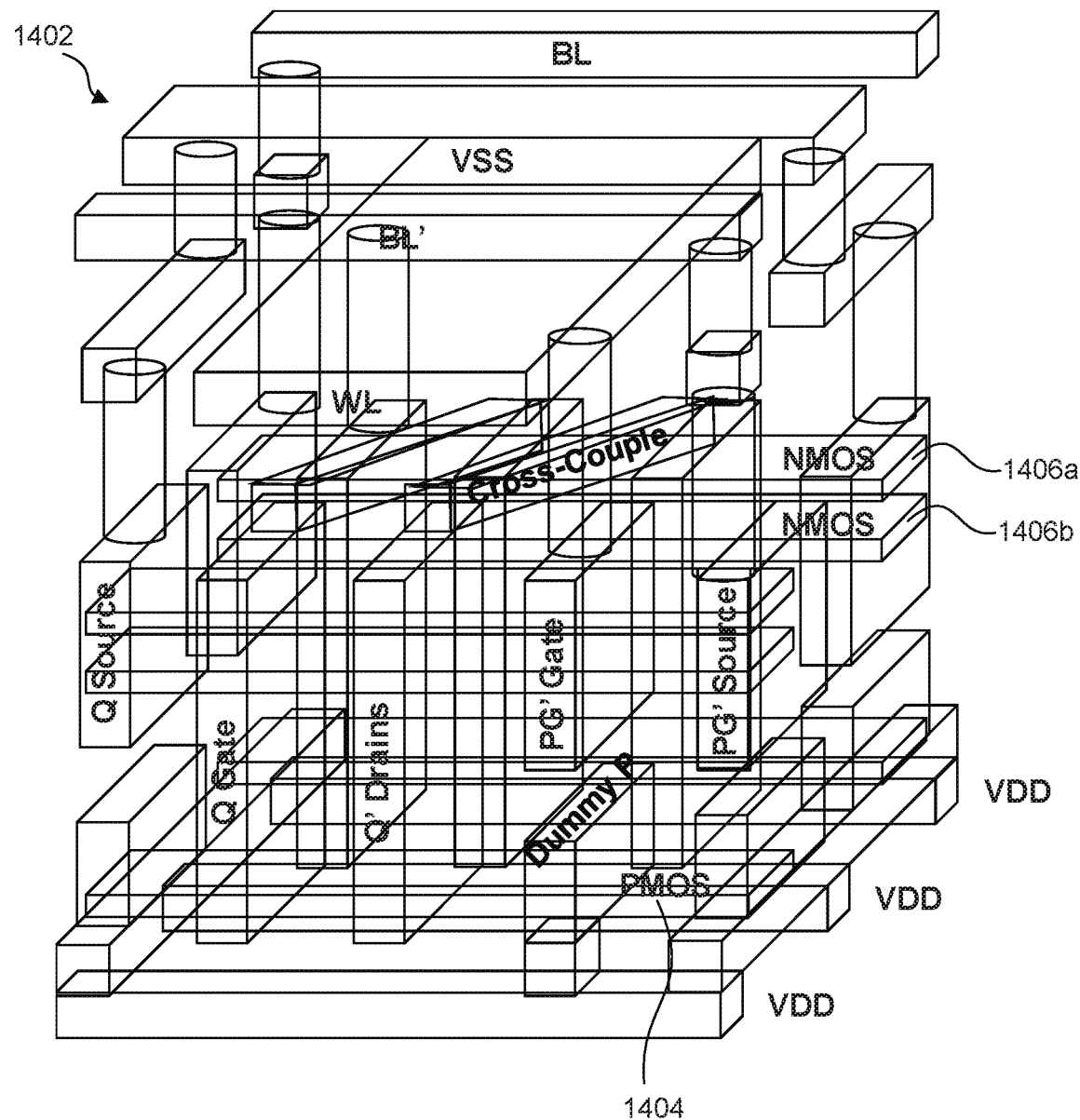
FIG. 14 illustrates a three-dimensional view of an SRAM bitcell using CFET architecture in accordance with some embodiments.

100471 FIG. 14 illustrates a three-dimensional view of an SRAM bitcell using CFET architecture in accordance with some embodiments. As shown in FIG. 14, an SRAM bitcell 1402 may include a PMOS channel 1404 and two NMOS channels 1406a and 1406b. As described above, the NMOS channels 1406a and 1406b are above the PMOS channel 1404. Power rails VDD may be buried power rails below transistors. Word line (WL) may be in an M0 metal layer while power rails for ground VSS, Bit lines BL and BL' may be in an M1 metal layer.

By way of a non-limiting example, in an SRAM bitcell, both NMOS and PMOS channels may be of same channel width. Both NMOS and PMOS channels may have a similar width as to the minimum metal width for a given technology node. However, more GAA layers may be provided for stronger NMOS. Higher SRAM density may be achieved by having PMOS under a pass gate (PG) that is implemented in NMOS, and, thereby, avoiding fin cuts. Further, in an SRAM cell, directions of M0 and M1 metal layers may be swapped with respect to the logic block. A wider WL in an M0 metal layer may provide low resistance and, thereby, improve the WL performance.

In some embodiments, by way of a non-limiting example, an SRAM bitcell based on CFET transistors can be 2*CPP wide and 4*MP tall with a narrow NMOS transistor on top of a narrow PMOS transistor. A parasitic PMOS transistor can be under NMOS pass gate.

Figure 15:
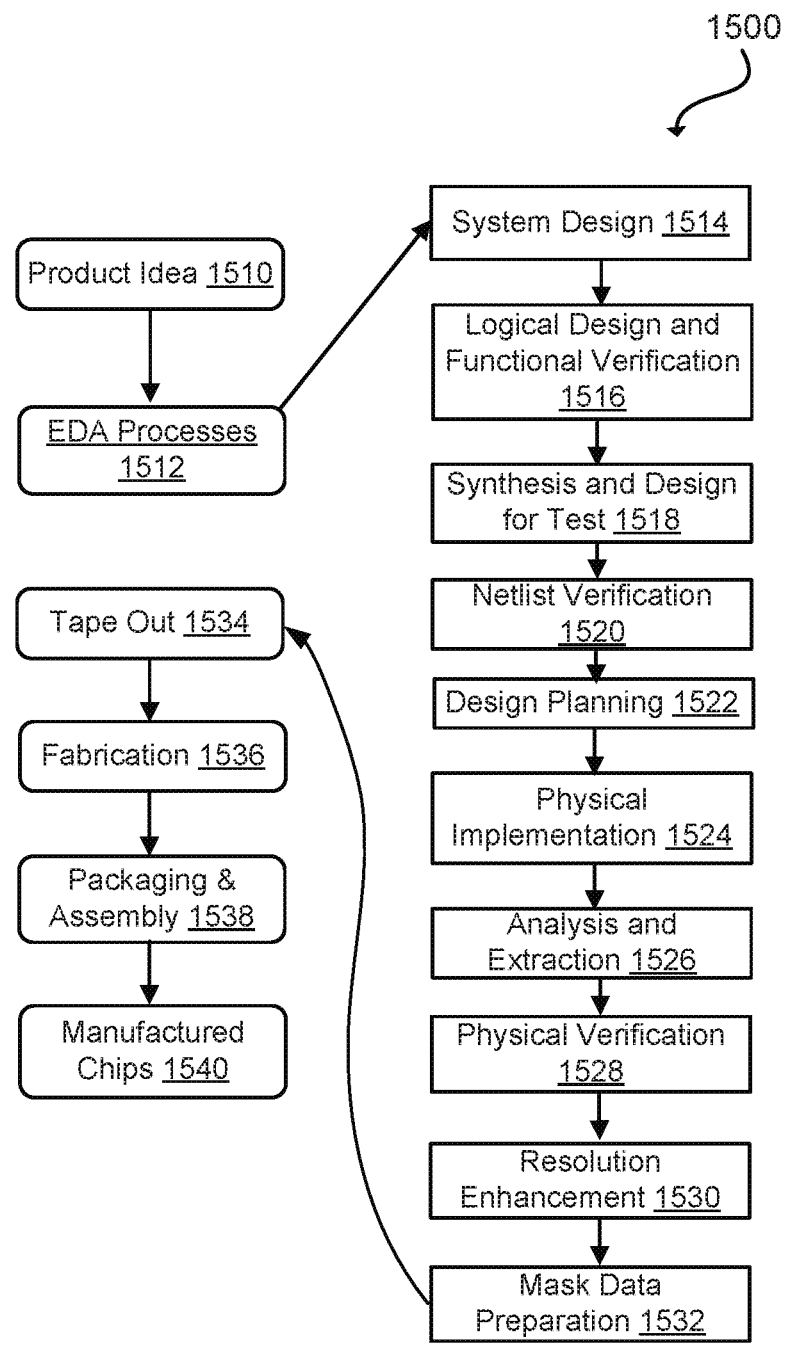
FIG. 15 illustrates a flowchart of various processes used during the design and fabrication of an integrated circuit, according to an exemplary aspect of the present disclosure.

FIG. 15 illustrates an example set of processes 1500 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1510 with information supplied by a designer, information that is transformed to create an article of manufacture that uses a set of EDA processes 1512. When the design is finalized, the design is taped-out 1534, which is when artwork (e.g., geometric patterns) for the integrated circuit is sent to a fabrication facility to manufacture the mask set, which is then used to manufacture the integrated circuit. After tape-out, a semiconductor die is fabricated 1536, and packaging and assembly processes 1538 are performed to produce the finished integrated circuit 1540.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 15. The processes described by being enabled by EDA products (or tools).

During system design 1514, the functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During the logic design and functional verification 1516, modules or components in the circuit are specified in one or more description languages, and the specification is checked for functional accuracy. For example, the components of the circuit may be verified to generate outputs that match the requirements of the specification of the circuit or system being designed. Functional verification may use simulators and other programs such as test bench generators, static HDL checkers, and formal verifiers. In some embodiments, special systems of components referred to as 'emulators' or 'prototyping systems' are used to speed up the functional verification.

During synthesis and design for test 1518, HDL code is transformed into a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1520, the netlist is checked for compliance with timing constraints and for correspondence with the HDL code. During design planning 1522, an overall floor plan for the integrated circuit is constructed and analyzed for timing and top-level routing.

During layout or physical implementation 1524, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1526, the circuit function is verified at the layout level, which permits refinement of the layout design. During physical verification 1528, the layout design is checked to ensure that manufacturing constraints are correct, such as DRC constraints, electrical constraints, lithographic constraints, and that circuitry function matches the HDL design specification. During resolution enhancement 1530, the geometry of the layout is transformed to improve how the circuit design is manufactured.

During tape-out, data is created to be used (after lithographic enhancements are applied if appropriate) for the production of lithography masks. During mask data preparation 1532, the 'tape-out' data is used to produce lithography masks that are used to produce finished integrated circuits.

A storage subsystem of a computer system (such as computer system 1700 of FIG. 17, or host system 1607 of FIG. 16) may be used to store the programs and data structures that are used by some or all of the EDA products described herein, and products used for the development of cells for the library and for the physical and logical design that use the library.

Figure 16:
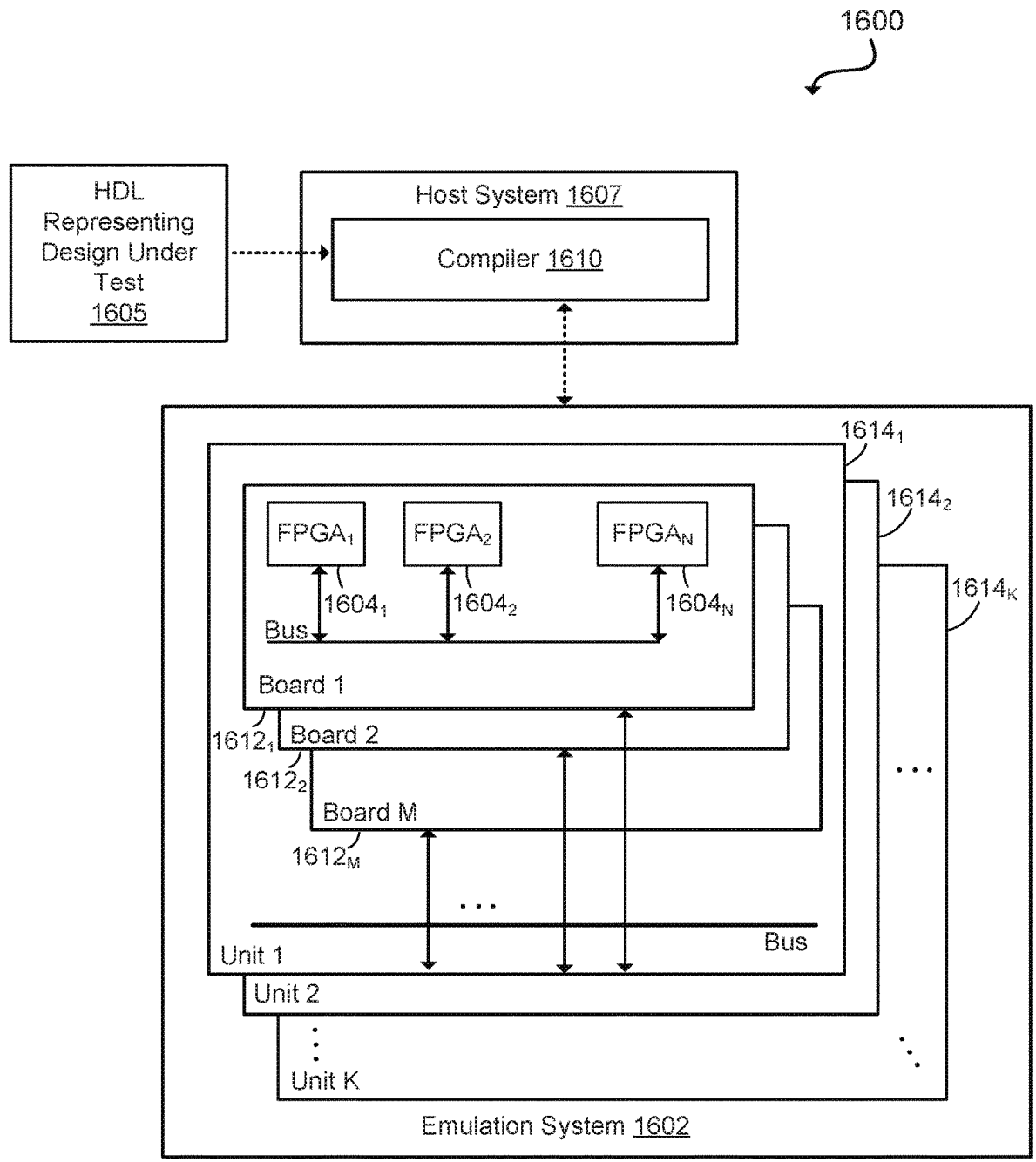
FIG. 16 illustrates an abstract diagram of an example emulation system, according to an exemplary aspect of the present disclosure.

FIG. 16 depicts an abstract diagram of an example emulation environment 1600. An emulation environment 1600 may be configured to verify the functionality of the circuit design. The emulation environment 1600 may include a host system 1607 (e.g., a computer that is part of an EDA system) and an emulation system 1602 (e.g., a set of programmable devices such as Field Programmable Gate Arrays (FPGAs) or processors). The host system generates data and information by using a compiler 1610 to structure the emulation system to emulate a circuit design. Circuit design to be emulated is also referred to as a Design Under Test ('DUT') where data and information from the emulation are used to verify the functionality of the DUT.

The host system 1607 may include one or more processors. In the embodiment where the host system includes multiple processors, the functions described herein as being performed by the host system can be distributed among the multiple processors. The host system 1607 may include a compiler 1610 to transform specifications written in a description language that represents a DUT and to produce data (e.g., binary data) and information that is used to structure the emulation system 1602 to emulate the DUT. The compiler 1610 can transform, change, restructure, add new functions to, and/or control the timing of the DUT.

The host system 1607 and emulation system 1602 exchange data and information using signals carried by an emulation connection. The connection can be but is not limited to, one or more electrical cables such as cables with pin structures compatible with the Recommended Standard 232 (RS232) or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 802.11. The host system 1607 and emulation system 1602 can exchange data and information through a third device such as a network server.

The emulation system 1602 includes multiple FPGAs (or other modules) such as FPGAs 1604$_1$ and 1604$_2$, as well as additional FPGAs to 1604$_N$. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, embodiments of emulators can include other types of logic blocks instead of, or along with, the FPGAs for emulating DUTs. For example, the emulation system 1602 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs 1604$_1$-1604$_N$ may be placed onto one or more boards 1612$_1$ and 1612$_2$ as well as additional boards through 1612$_M$. Multiple boards can be placed into an emulation unit 1614$_1$. The boards within an emulation unit can be connected using the backplane of the emulation unit or any other types of connections. In addition, multiple emulation units (e.g., 1614$_1$ and 1614$_2$ through 1614$_K$) can be connected to each other by cables or any other means to form a multi-emulation unit system.

For a DUT that is to be emulated, the host system 1607 transmits one or more bit files to the emulation system 1602. The bit files may specify a description of the DUT and may further specify partitions of the DUT created by the host system 1607 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 1607 receives a description of a DUT that is to be emulated. In some embodiments, the DUT description is in a description language (e.g., a register transfer language (RTL)). In some embodiments, the DUT description is in netlist level files or a mix of netlist level files and HDL files. If part of the DUT description or the entire DUT description is in an HDL, then the host system can synthesize the DUT description to create a gate-level netlist using the DUT description. A host system can use the netlist of the DUT to partition the DUT into multiple partitions, where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAs each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT, which includes interface signals and states of interface signals that have been traced by the trace and injection logic of each FPGA. The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In the case of multiple re-emulations of an FPGA, merging the results produces a full debug view.

The host system receives, from the emulation system, signals traced by the logic of the identified FPGAs during the re-emulation of the component. The host system stores the signals received from the emulator. The signals traced during the re-emulation can have a higher sampling rate than the sampling rate during the initial emulation. For example, in the initial emulation, a traced signal can include a saved state of the component every X milliseconds. However, in the re-emulation, the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterward, the circuit designer can request to re-emulate the same component for a different time period or to re-emulate another component.

A host system 1607 and/or the compiler 1610 may include subsystems such as, but not limited to, a design synthesizer sub-system, a mapping sub-system, a run time sub-system, a results sub-system, a debug sub-system, a waveform sub-system, and a storage sub-system. The sub-systems can be structured and enabled as an individual or multiple modules, or two or more may be structured as a module. Together these sub-systems structure the emulator and monitor the emulation results.

The design synthesizer sub-system transforms the HDL that is representing a DUT 1605 into gate-level logic. For a DUT that is to be emulated, the design synthesizer sub-system receives a description of the DUT. If the description of the DUT is fully or partially in HDL (e.g., RTL or another level of abstraction), the design synthesizer sub-system synthesizes the HDL of the DUT to create a gate-level netlist with a description of the DUT in terms of gate-level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate-level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), a signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states, and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that is associated with the time period.

The debug sub-system transmits the retrieved interface signals to the emulator. The debug sub-system instructs the debug sub-system to use the identified FPGAs and for the trace and injection logic of each identified FPGA to inject its respective traced signals into the logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to use all the cycles collectively.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

Figure 17:
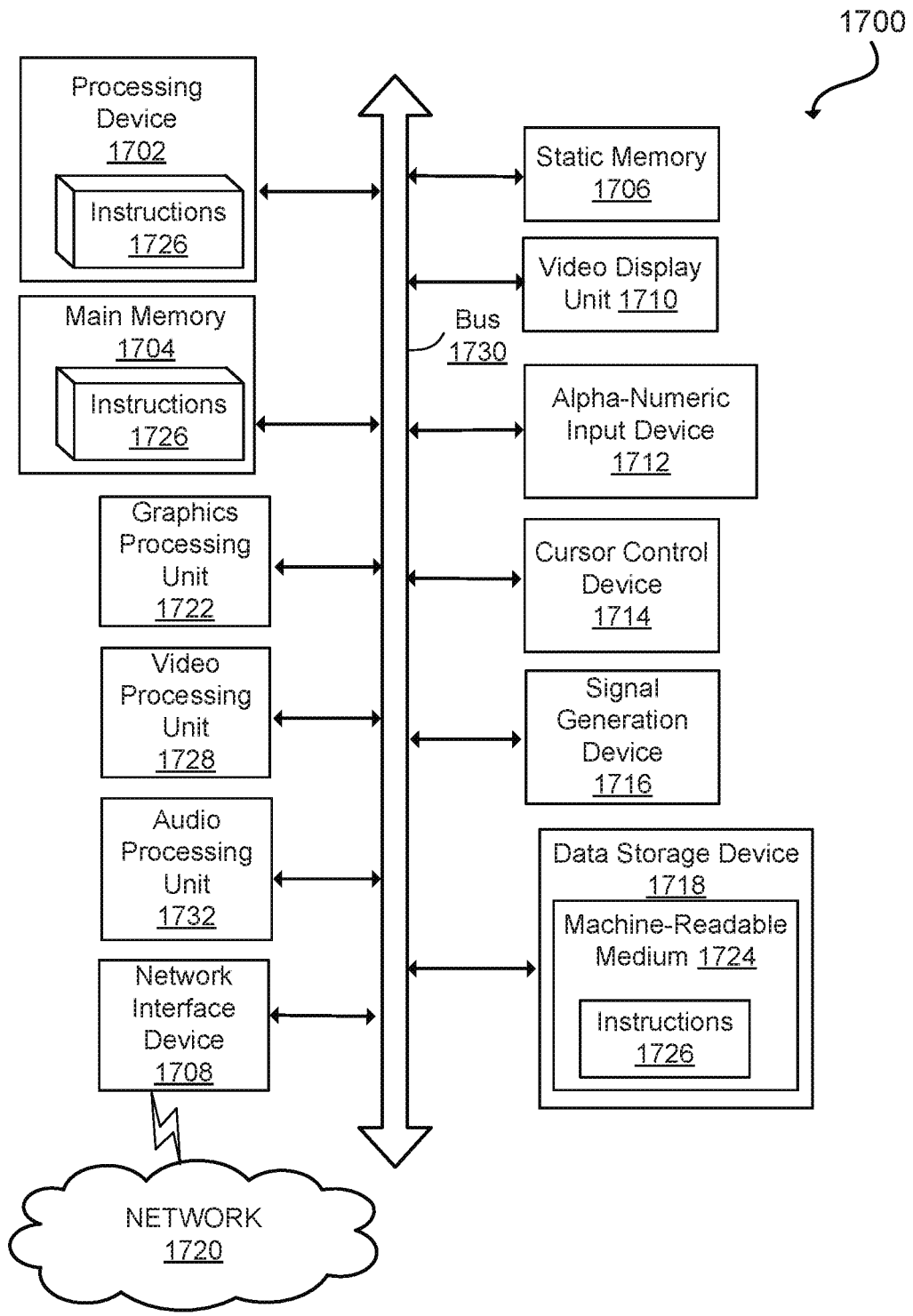
FIG. 17 illustrates an abstract diagram of an example computer system in which aspects of the present disclosure may operate.

FIG. 17 illustrates an example machine of a computer system 1700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in a client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1700 includes a processing device 1702, a main memory 1704 (e.g., read-only memory (ROM), flash memory, dynamic random access memory (DRAM) such as synchronous DRAM (SDRAM), a static memory 1706 (e.g., flash memory, static random access memory (SRAM), etc.), and a data storage device 1718, which communicate with each other via a bus 1730.

The processing device 1702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 1702 may also be one or more special-purpose processing devices such as an application-specific integrated circuit (ASIC), a field-programmable gate array (FPGA), a digital signal processor (DSP), network processor, or the like. The processing device 1702 may be configured to execute instructions 1726 for performing the operations and steps described herein.

The computer system 1700 may further include a network interface device 1708 to communicate over the network 1720. The computer system 1700 also may include a video display unit 1710 (e.g., a liquid crystal display (LCD) or a cathode ray tube (CRT)), an alphanumeric input device 1712 (e.g., a keyboard), a cursor control device 1714 (e.g., a mouse), a graphics processing unit 1722, a signal generation device 1716 (e.g., a speaker), graphics processing unit 1722, video processing unit 1728, and audio processing unit 1732.

The data storage device 1718 may include a machine-readable storage medium 1724 (also known as a non-transitory computer-readable medium) on which is stored one or more sets of instructions 1726 or software embodying any one or more of the methodologies or functions described herein. The instructions 1726 may also reside, completely or at least partially, within the main memory 1704 and/or within the processing device 1702 during execution thereof by the computer system 1700, the main memory 1704, and the processing device 1702 also constituting machine-readable storage media.

In some implementations, the instructions 1726 include instructions to implement functionality corresponding to the present disclosure. While the machine-readable storage medium 1724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to convey the substance of their work to others skilled in the art most effectively. An algorithm may be a sequence of operations leading to the desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer-readable storage medium, such as but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure, as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as read-only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures, and like elements are labeled with like numerals. The disclosure and drawings are, accordingly, to be regarded in an illustrative sense rather than a restrictive sense.

What is claimed is:

1. An integrated circuit comprising a digital logic library cell based on complementary-field effect transistor (CFET) architecture, the digital logic library cell comprising:
    an n-channel metal-oxide-semiconductor (NMOS) gate-all-around (GAA) channel in a first layer of an electronic structure; and
    a p-channel metal-oxide-semiconductor (PMOS) GAA channel in a second layer of the electronic structure,
        wherein the PMOS GAA channel is wider compared to the NMOS GAA channel,
        wherein the first layer is above the second layer and separated by a dielectric layer,
        wherein a space surrounding the NMOS GAA channel is used to access the PMOS GAA channel, and
        wherein a parasitic PMOS transistor of the PMOS GAA channel is disposed under an NMOS pass gate of the NMOS GAA channel.

2. The integrated circuit comprising the digital logic library cell of claim 1, wherein the PMOS GAA channel is of a width sufficient to fit within a cell height of the electronic structure.

3. The integrated circuit comprising the digital logic library cell of claim 1, wherein the PMOS GAA channel is 2 metal tracks narrower than a cell height of the electronic structure.

4. The integrated circuit comprising the digital logic library cell of claim 1, wherein the NMOS GAA channel is of a width sufficient to allow two metal tracks to be connected to the PMOS GAA channel below.

5. The integrated circuit comprising the digital logic library cell of claim 1, wherein a cell height of the electronic structure is 4 tracks high (4 T).

6. The integrated circuit comprising the digital logic library cell of claim 1, wherein a cell height of the electronic structure is 5 tracks high (5 T).

7. The integrated circuit comprising the digital logic library cell of claim 1, wherein a cell height of the electronic structure is 6 tracks high (6 T).

8. The integrated circuit comprising the digital logic library cell of claim 1, wherein the space surrounding the NMOS GAA channel is used to access a gate of the PMOS GAA channel.

9. The integrated circuit comprising the digital logic library cell of claim 1, further comprising a power rail and a ground, wherein the power rail and the ground are buried below the PMOS GAA channel and the NMOS GAA channel.

10. A static random access memory (SRAM) bitcell based on complementary-field effect transistor (CFET) architecture, the SRAM bitcell comprising:
    an n-channel metal-oxide-semiconductor (NMOS) gate-all-around (GAA) channel in a first layer; and
    a p-channel metal-oxide-semiconductor (PMOS) GAA channel in a second layer, wherein the PMOS GAA channel is as narrow as the NMOS GAA channel, wherein the first layer is above the second layer and separated by a dielectric layer, wherein a space surrounding the NMOS GAA channel is used to access the PMOS GAA channel, and wherein a parasitic PMOS transistor of the PMOS GAA channel is disposed under an NMOS pass gate of the NMOS GAA channel.

11. The SRAM bitcell of claim 10, further comprising cross-coupled inverters and a plurality of pass gates.

12. The SRAM bitcell of claim 10, further comprising an additional NMOS GAA channel.

13. The SRAM bitcell of claim 10, wherein the SRAM bitcell is 2*contacted poly pitch (CPP) wide and 4*minimum metal pitch (MP) tall with a narrow NMOS GAA channel transistor on top of a narrow PMOS GAA channel transistor, and a parasitic PMOS transistor under an NMOS pass gate.

14. The SRAM bitcell of claim 10, wherein a cell height of the SRAM bitcell is 4 tracks high (4 T).

15. The SRAM bitcell of claim 10, wherein a cell height of the SRAM bitcell is 5 tracks high (5 T).

16. The SRAM bitcell of claim 10, wherein a cell height of the SRAM bitcell is 6 tracks high (6 T).

17. A method for generating an electronic structure based on complementary-field effect transistor (CFET) architecture, the method comprising:
    creating an n-channel metal-oxide-semiconductor (NMOS) gate-all-around (GAA) channel in a first layer of the electronic structure of a first width; and
    creating a p-channel metal-oxide-semiconductor (PMOS) GAA channel in a second layer of the electronic structure of a second width;
    wherein the first width and the second width is determined based on a type of the electronic structure,
    wherein the first layer is above the second layer and separated by a dielectric layer, and wherein a space surrounding the NMOS GAA channel is used to access the PMOS GAA channel, and wherein a parasitic PMOS transistor of the PMOS GAA channel is disposed under an NMOS pass gate of the NMOS GAA channel.

18. The method of claim 17, wherein the type of the electronic structure is a digital logic library cell, and wherein the first width is larger than the second width.

19. The method of claim 17, wherein the type of the electronic structure is a static random access memory (SRAM) bitcell, and wherein the first width is same as the second width.

20. The method of claim 17, further comprising inserting a power rail and a ground below the PMOS GAA channel and the NMOS GAA channel.

* * * * *